United States Patent [19]

Hashinaga

[11] Patent Number: 5,410,261

[45] Date of Patent: Apr. 25, 1995

[54] SEMICONDUCTOR DEVICE TESTING APPARATUS

[75] Inventor: Tatsuya Hashinaga, Kanagawa, Japan

[73] Assignee: Sumitomo Electric Industries, Ltd., Osaka, Japan

[21] Appl. No.: 909,686

[22] Filed: Jul. 7, 1992

[30] Foreign Application Priority Data

Jul. 9, 1991 [JP] Japan ................. 3-194844
Jul. 9, 1991 [JP] Japan ................. 3-194845

[51] Int. Cl.⁶ ............................................. G01R 31/02
[52] U.S. Cl. .................................... 324/765; 324/754
[58] Field of Search ............... 73/517 A, 535, 432, 73/865.3, 827, 856; 374/45, 46, 179; 324/72.5, 158 P, 158 F, 765, 754; 439/482, 824; 437/8

[56] References Cited

U.S. PATENT DOCUMENTS

| | | | |
|---|---|---|---|
| 2,773,731 | 12/1956 | Chick et al. | 324/158 F |
| 3,544,949 | 12/1970 | Panasjuk | 339/8 |
| 4,532,423 | 7/1985 | Tojo et al. | 324/158 F |
| 4,807,483 | 2/1989 | Wright et al. | 73/865.3 |
| 4,816,756 | 3/1989 | Fox | 324/158 MG |
| 4,871,865 | 10/1989 | Elbert et al. | 324/158 F |
| 4,999,211 | 3/1991 | Duggan | 324/158 F |
| 5,143,450 | 9/1992 | Smith et al. | 374/179 |

FOREIGN PATENT DOCUMENTS

| | | | |
|---|---|---|---|
| 45-21536 | 7/1970 | Japan | 324/158 F |
| 0000559 | 1/1982 | Japan | 324/158 F |
| 0218667 | 12/1983 | Japan | 324/158 F |
| 0118672 | 5/1988 | Japan | 324/158 F |
| 0184476 | 7/1989 | Japan | 324/158 F |
| 0295176 | 11/1989 | Japan | 324/158 F |
| 0035374 | 2/1990 | Japan | 324/158 F |
| 0165236 | 9/1964 | U.S.S.R. | 324/158 F |
| 0299045 | 3/1971 | U.S.S.R. | 324/158 F |
| 0477566 | 7/1975 | U.S.S.R. | 324/158 F |

OTHER PUBLICATIONS

Patent Abstract of Japan, vol. 6, No. 170 (E-128) 3 Sep. 1982 and JP-A-57 087 148 (NEC) 31 May 1982, Abstract.

Method 3001.1-4007, MIL-STD-883C Aug. 25, 1983 Drive Source, Dynamic.

JIS 7022 Japan 1979 (Full Japanese text and relevant portions translated into English).

Primary Examiner—Vinh Nguyen
Attorney, Agent, or Firm—Cushman Darby & Cushman

[57] ABSTRACT

A testing apparatus which assures that a constant acceleration test and an AC continuous operation test can be simultaneously conducted on semiconductor devices to be tested. The testing apparatus includes a rotatable turntable with semiconductor devices to be tested mounted thereon, rotary terminals electrically connected to connection pins of the semiconductor devices mounted on the turntable and adapted to rotate together with the turntable, and stationary terminals adapted to intermittently or continuously slidably contact the rotary terminals while the turntable is rotated.

10 Claims, 5 Drawing Sheets

SEMICONDUCTOR DEVICE TESTING APPARATUS

BACKGROUND OF THE INVENTION

1. Field of the Invention

The present invention relates to a semiconductor testing apparatus, and more particularly to a semiconductor testing apparatus capable of performing constant acceleration testing and AC (alternating current) continuous operation testing simultaneously.

2. Description of the Related Art

The usefulness of semiconductor devices are rapidly increasing. Moreover, the applications of very dependable semiconductor devices have greatly increased also. Each semiconductor device must be exhaustively tested to guarantee their physical and electrical reliability. Two commonly performed reliability tests are a constant acceleration test and an AC continuous operation test.

FIG. 1 (prior art) illustrates a conventional constant acceleration testing apparatus. Semiconductor devices 4a & 4b are placed into holders 3a & 3b respectively. The holders 3a & 3b are attached to an opposing pair of arms 2a & 2b respectively which are connected to a main shaft 1. The main shaft 1 rotates about its center axis to generate a large acceleration which is applied to the semiconductor devices 4a & 4b through the opposing pair of arms 2a & 2b. The large acceleration is applied to the semiconductor devices to determine the physical integrity of the semiconductor devices. If the semiconductor devices are flawless, they will continue to operate as they were designed to operate.

FIG. 2 (prior art) illustrates a conventional AC continuous operation testing apparatus with like reference numerals designating corresponding parts in FIGS. 1 and 2. An AC power source 5 is electrically connected to at least one connection pin 6 of a plurality of connection pins on the semiconductor device 4. Power from AC power source 5 is applied to the semiconductor device 4 to evaluate the electrical reliability of the semiconductor device 4.

The normal procedure for testing the dependability of semiconductor devices is to sequentially perform the constant acceleration and AC continuous operation tests. However, due to the extraordinary increase in the rate of manufacturing semiconductor devices, the rate of testing the semiconductor devices has become unacceptably slow. Therefore, a queue builds up between the manufacturing stage and the testing stage which is an extremely inefficient manner to process semiconductor devices.

There has yet to be devised a semiconductor device test apparatus which expedites testing by providing numerous reliability tests within a single test device. The present invention overcomes the problem of relatively slow and inefficient testing of semiconductor devices by performing concurrent multiple tests on the semiconductor devices.

SUMMARY OF THE INVENTION

It is an object of the present invention to provide a semiconductor device test apparatus for testing physical and electrical integrity of a semiconductor device more quickly than is currently possible. It is a further object of the present invention to provide a semiconductor device test apparatus capable of simultaneously performing multiple testing functions or more particularly simultaneously performing constant acceleration and AC continuous operation tests.

In accordance with the present invention, a turntable capable of rotating is provided, having a holder for firmly holding the semiconductor devices when the turntable rotates. The turntable includes a rotary terminal electrically connected to at least one connection pin of the plurality of connection pins residing upon the semiconductor device which is held by the holder, so the rotary terminal is capable of rotating with the turntable. A stationary terminal attached to a stationary platform or drum opposing the turntable is capable of continuously or intermittently contacting the rotary terminal when the turntable and rotary terminal rotate. The stationary platform may be positioned around the turntable or the turntable may be positioned around the stationary platform.

A distinguishing feature of the testing apparatus of the present invention is that a constant acceleration test and an AC continuous operation test can be simultaneously performed for each semiconductor device. More specifically, the testing apparatus of the present invention includes a turntable which rotates while semiconductor devices are firmly mounted thereon. The turntable includes a rotary terminal which electrically connects at least one of a plurality of connection pins on the semiconductor devices. In addition, at least one stationary terminal is positioned opposing the rotary terminal to intermittently or continuously contact the rotary terminal when the rotary terminal is rotated. Furthermore, the stationary terminal is electrically connected to a power source. Therefore, electricity is allowed to continuously or intermittently flow to the semiconductor devices on the turntable via the rotary terminal.

The above described semiconductor device testing apparatus operates in the following manner. Semiconductor devices to be tested are firmly mounted on the turntable in the holders. The turntable is quickly rotationally accelerated thereby applying an enormous amount of acceleration to the semiconductor devices.

The semiconductor devices are periodically or continuously connected to the power supply via the rotary terminal contacting the stationary terminal when the turntable rotates. At the same time, the power supply is electrically connected to the stationary terminal. In the case that the stationary terminals are intermittently electrically connected to the rotary terminal, a voltage applied to each semiconductor device periodically varies while a DC power source is electrically connected to the rotary terminals. On the other hand, in the case that the stationary terminals are continuously electrically connected to the rotary terminal, an AC voltage supply is applied to each semiconductor device while an AC power supply is electrically connected to the stationary terminals.

With the specific construction of the present invention as previously described, if the semiconductor device test apparatus is correctly used, a constant acceleration test and an AC continuous test can be performed concurrently.

Other objects, features, and characteristics of the present invention as well as the methods of operation and further functions of the related elements of structure, and the combination of parts and economies of manufacture, will become more apparent upon consideration of the following description and the appended claims with reference to the accompanying drawings, all of which form a part of this specification, wherein like reference numerals designate corresponding parts in the various Figures.

DETAILED DESCRIPTION OF THE PREFERRED EMBODIMENTS

Figure 3:
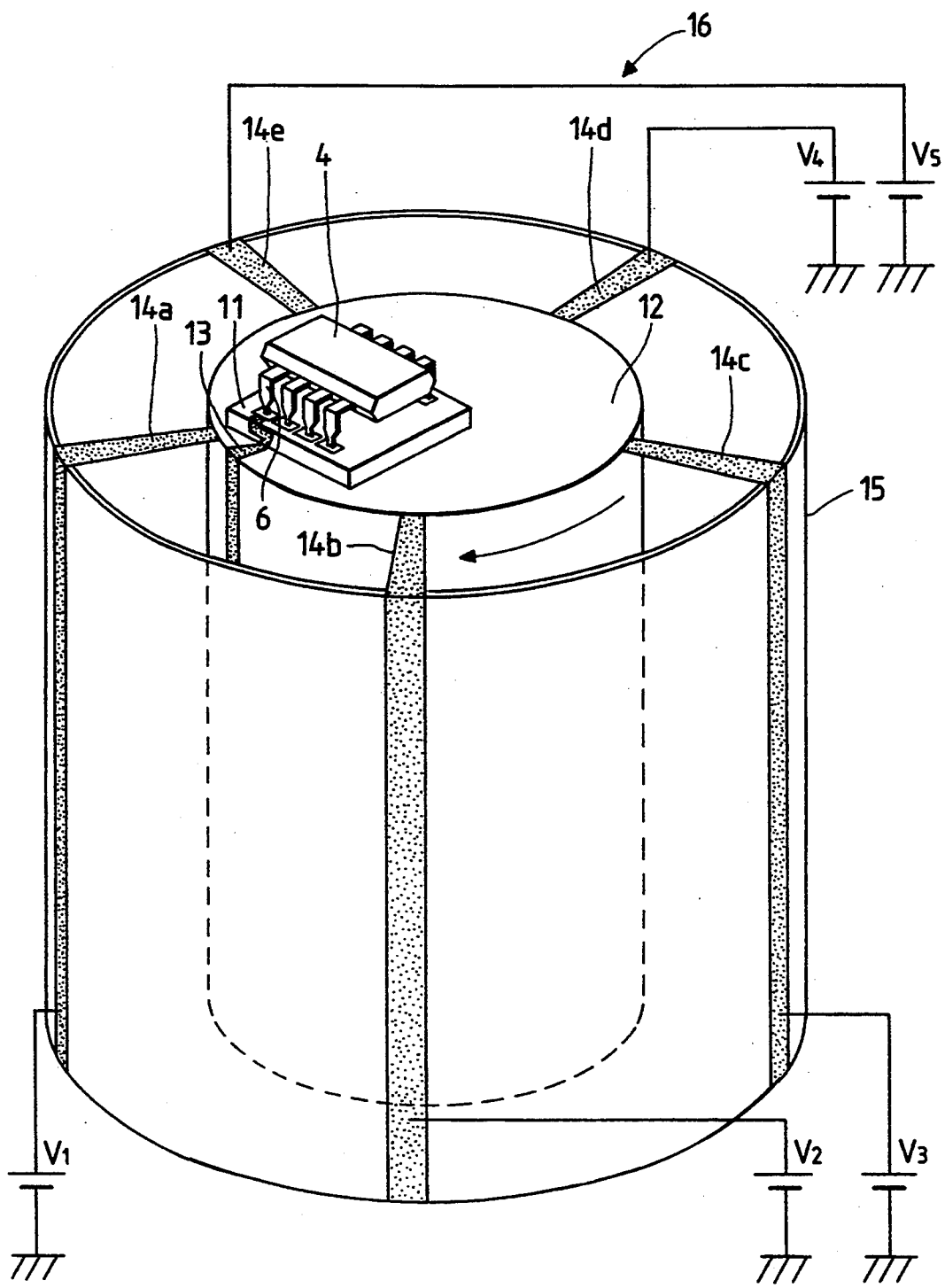
FIG. 3 is a diagram of a semiconductor device test apparatus in accordance with a first embodiment of the present invention.

As shown in FIG. 3, a first embodiment of a semiconductor device test apparatus in accordance with the present invention is designated generally by the reference character 16. As shown, the semiconductor device test apparatus includes a holder 11 which holds a semiconductor device 4 mounted on a turntable 12. A rotary terminal 13 is provided on the turntable 12 which is cylindrical in shape and is electrically connected to a connection pin 6 of a plurality of connection pins on the semiconductor device 4. A drum 15 which is annular in shape surrounding the turntable 12 supports a plurality of stationary terminals 14a to 14e arranged around the turntable 12. The rotary terminal 13 and stationary terminals 14a to 14e are arranged so they electrically connect with each other when they are directly opposing due to a rotation as depicted by the arrow in FIG. 3. Power supplies $V_1$ to $V_5$ are attached to the stationary terminals 14a to 14e respectively situated on drum 15.

The holder 11 and the rotary terminal 13 rotate together, since they are both located on the turntable 12. The holder 11 is located near the outer peripheral edge of the turntable 12 to ensure that a sufficiently large centrifugal force is exerted on the semiconductor device 4 held by the holder 11 while the turntable 12 is rotated. In addition, the rotary terminal 13 is located at a position which is coincident with the outer peripheral edge of the turntable 12 and is electrically connected to at least one connection pin 6 of the semiconductor device 4. In this condition, at least one of the pins of the semiconductor device 4 is grounded.

Furthermore, the plurality of stationary terminals 14a to 14e (five stationary terminals are shown in the exemplary case) are arranged around the drum 15. The stationary terminals 14a to 14e are electrically connected to independent power sources $V_1$ to $V_5$. Thus, as the turntable 12 rotates, the stationary terminals 14a to 14e periodically come in contact with the rotary terminal 13.

Consequently, the testing apparatus as described in the first embodiment operates in the following manner. The semiconductor device 4 to be tested is firmly mounted in the holder 11 situated on turntable 12. At the same time, one of the connection pins 6 on the semiconductor device 4 is electrically connected to the rotary terminal 13. Subsequently, a predetermined magnitude of rotational acceleration is applied to the semiconductor device 4 corresponding to the rotational speed of the turntable 12 under the effect of centrifugal force as the turntable 12 is rotated. The speed of rotation of the turntable 12 may be up approximately to 50,000 rps (round per second).

In addition, as the turntable 12 is rotated, the rotary terminal 13 is successively brought into contact with the stationary terminals 14a to 14e fixed to the drum 15. Thus, DC voltages supplied from power sources $V_1$ to $V_5$ are periodically applied to the connection pin 6 of the semiconductor device 4. The voltage to be applied to the device may be an alternate voltage if desired.

Figure 4:
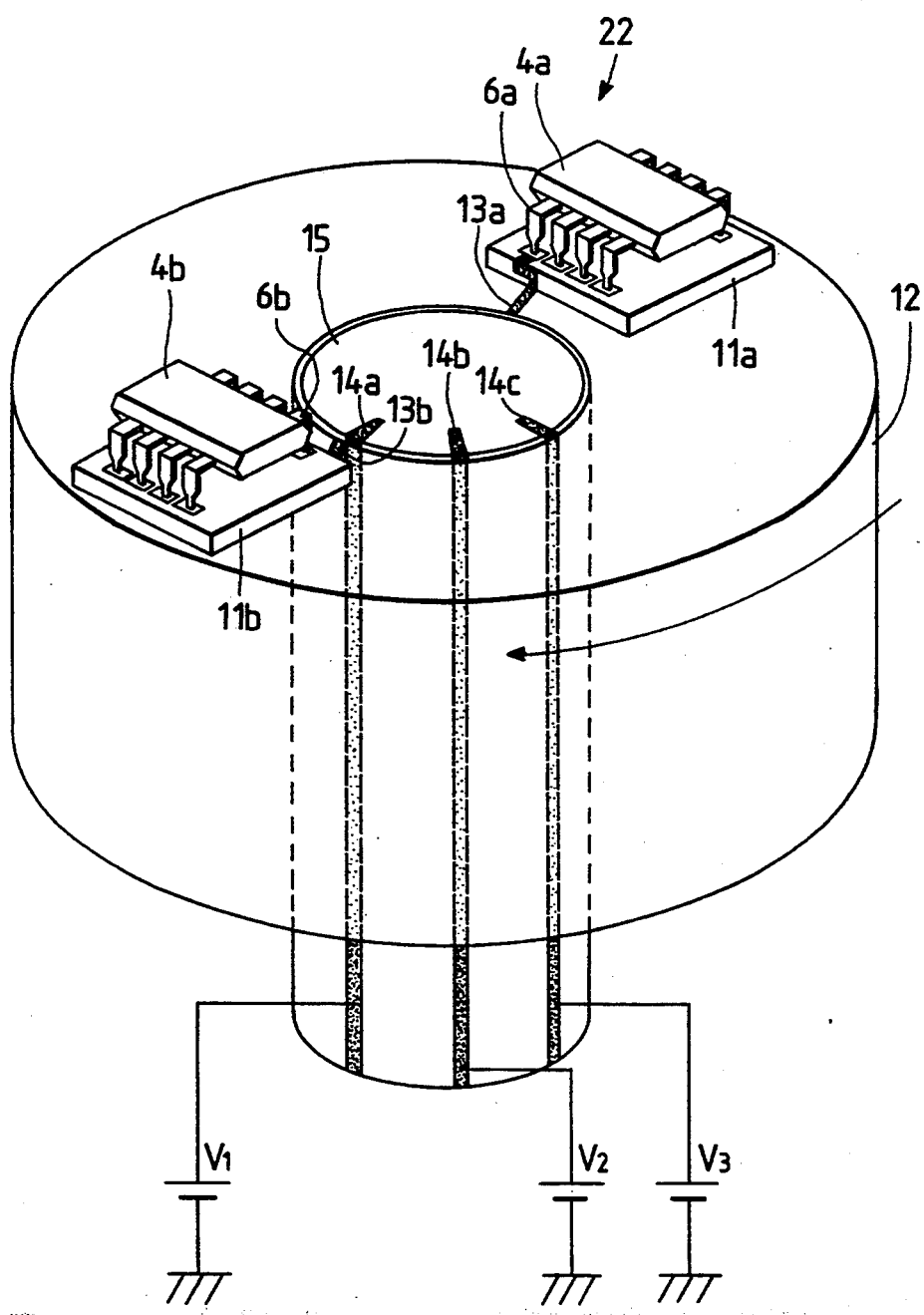
FIG. 4 is a diagram of a semiconductor device test apparatus in accordance with a second embodiment of the present invention.

As shown in FIG. 4, a second embodiment of a semiconductor device test apparatus in accordance with the present invention is designated generally by the reference character 22. As shown, the semiconductor device test apparatus includes the turntable 12 which is annular in shape with holders 11a and 11b for holding the semiconductor devices 4a and 4b respectively mounted thereon. Rotary terminals 13a and 13b are electrically connected to connection pins 6a and 6b respectively. The turntable 12 surrounds the drum 15 which is cylindrical in shape. Furthermore, the cylindrical drum 15 has stationary terminals 14a to 14c mounted thereon which are connected to power sources $V_1$ to $V_3$ respectively.

The holders 11a and 11b and the pair of rotary terminals 13a and 13b rotate together, for they are both mounted on the turntable 12. Each of the rotary terminals 13a and 13b is electrically connected to at least one connection pin 6a and 6b on each of the semiconductor devices 4a and 4b, respectively and one end of each of the rotary terminals 13a and 13b reaches the end surface coincident with the inner wall surface of the turntable 12.

On the other hand, a plurality of stationary terminals 14a to 14c (three stationary terminals in the exemplary case shown) are electrically connected to power sources $V_1$ to $V_3$ respectively. Thus, as the turntable 12 is rotated, the stationary terminals 14a to 14c periodically come in contact with the rotary terminals 13a and 13b.

Consequently, the testing apparatus as described in the second embodiment operates in the following manner. The semiconductor devices 4a and 4b to be tested are firmly mounted on the holder 11 placed on the turntable 12. At the same time, one connection pin 6 of the plurality of connection pins on each of the semiconductor devices 4a and 4b is electrically connected to each of the rotary terminals 13a and 13b, respectively. Subsequently, a predetermined magnitude of rotational acceleration is applied to the semiconductor devices 4a and 4b corresponding to the rotational speed of the turntable 12 under the effect of the centrifugal force induced as the turntable 12 is rotated.

In addition, as the turntable 12 is rotated, the rotary terminals 13a and 13b are successively brought in contact with the stationary terminals 14a to 14c fixedly secured to the drum 15. Thus, DC voltages supplied from the power sources $V_1$ to $V_3$ are periodically applied to the terminals of the semiconductor devices 4a and 4b.

Figure 1:
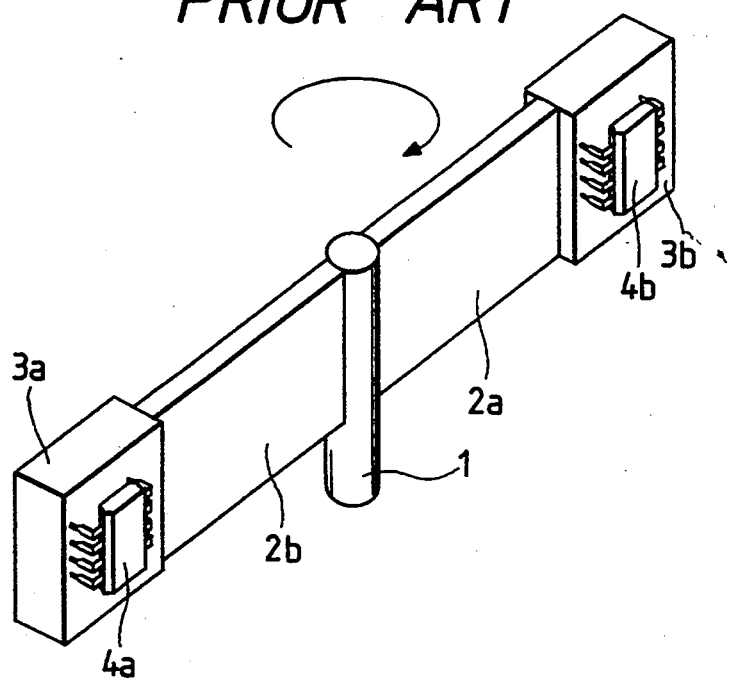
FIG. 1 (prior art) is a diagram of an exemplary constant acceleration testing apparatus for determining physical dependability of semiconductor devices.
Figure 2:
FIG. 2 (prior art) is a diagram of an exemplary AC continuous operation testing apparatus for determining electrical dependability of semiconductor devices.
Figure 5:
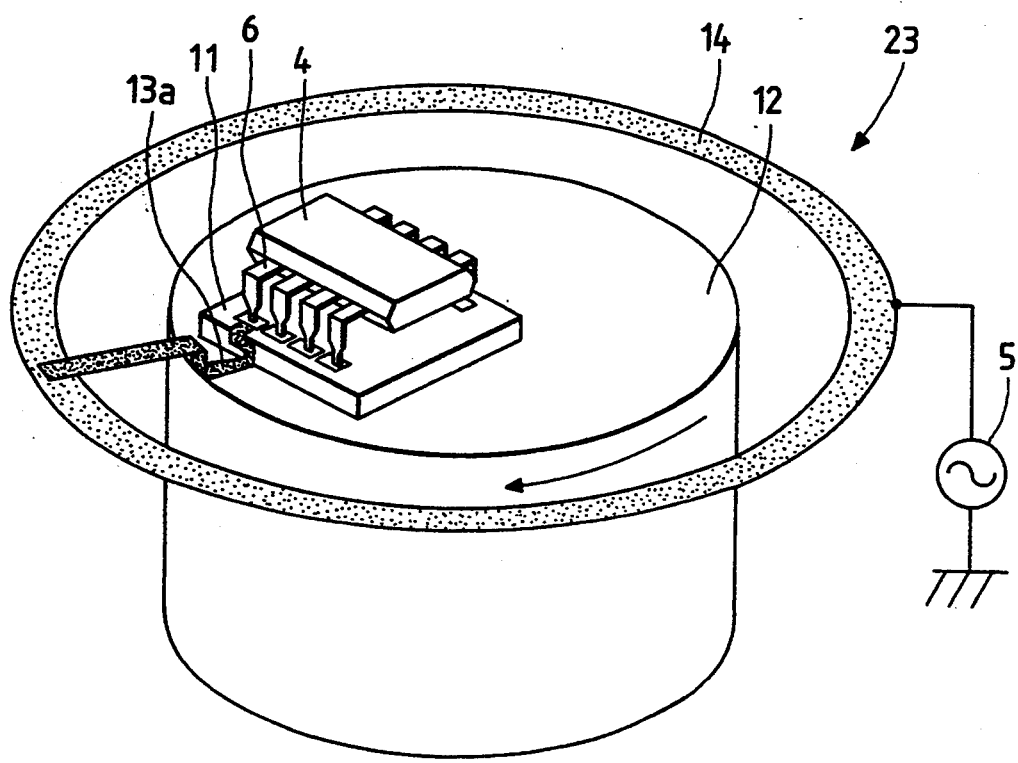
FIG. 5 is a diagram of a semiconductor device test apparatus in accordance with a third embodiment of the present invention.

As shown in FIG. 5, a third embodiment of a semiconductor device test apparatus in accordance with the present invention is designated generally by the reference character 23. As shown in the drawing, this apparatus essentially has the same structure as the testing apparatus shown in FIG. 3. However, the rotary electrode 13a arranged on the turntable 12 and the stationary terminal 14 firmly mounted on the drum 15 side have different shape and structure from those of the testing apparatus shown in FIG. 3. It should be noted that no drum 15 is shown in FIG. 2 to making it easier to visually understand the structure of the testing apparatus but a drum 15 would be positioned around the turntable 12 similarly as shown in FIG. 3.

In this embodiment, the rotary terminal 13a extends outside of the turntable 12 to slidably come in contact with the stationary electrode 14 which is annular in shape and is disposed on the upper end surface of the drum 15 (not shown). Thus, the testing apparatus is constructed so that the stationary electrode 14 is electrically connected to the rotary electrode 13a at all times.

With the apparatus constructed in the above-described manner, while an AC power source is electrically connected to the stationary electrode 14, an arbitrary magnitude of AC electricity can always be fed to a semiconductor device 4 for which a constant acceleration test is conducted.

Therefore, while the foregoing is maintained, a constant acceleration test and an AC continuous operation test are simultaneously conducted on the semiconductor device 4.

Figure 6:
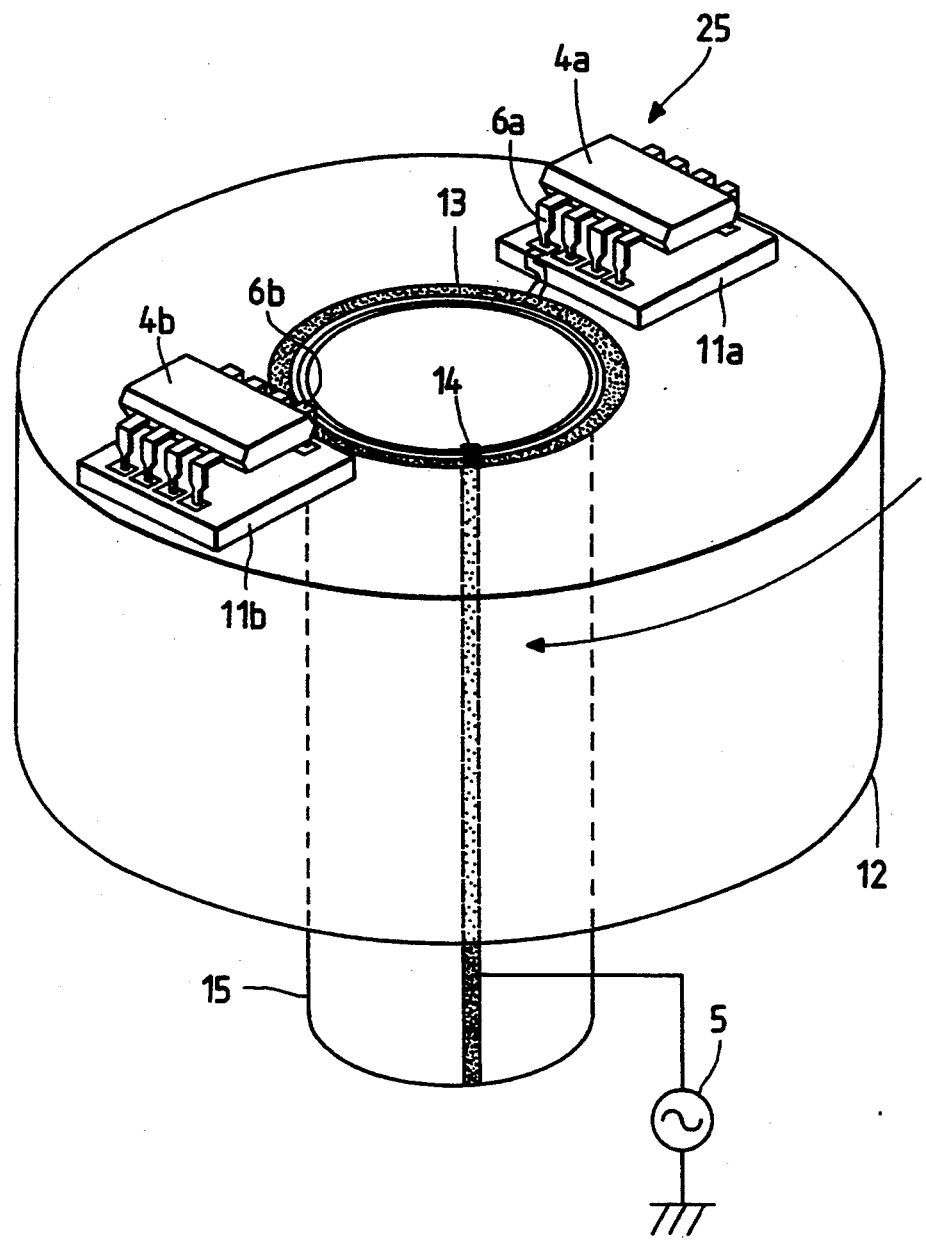
FIG. 6 is a diagram of a semiconductor device test apparatus in accordance with a fourth embodiment of the present invention.

As shown in FIG. 6, a fourth embodiment of a semiconductor device test apparatus in accordance with the present invention is designated generally by the reference character 25. As shown in the drawing, this testing apparatus is essentially the same as the structure of the testing apparatus shown in FIG. 4. The difference between the testing apparatus shown in FIG. 6 and that shown in FIG. 4 is that the rotary electrode 13 is annular and mounted on the turntable 12 and the stationary electrode 14 located on the drum 15 has different shape and structure from those in the testing apparatus shown in FIG. 4.

Specifically, in this embodiment, the rotary terminal 13 radially extends toward the inner peripheral edge of the turntable 12 to slidably come in contact with the stationary electrode 14 disposed on the upper end surface of the drum 15. Thus, the testing apparatus is constructed such that the stationary electrode 14 is electrically connected to the rotary electrode 13 at all times.

With the apparatus constructed in the above-described manner, while an AC power source 5 is electrically connected to the stationary electrode 14, an arbitrary magnitude of AC electricity can always be fed to the semiconductor devices 4a and 4b for which a constant acceleration test is conducted.

Therefor, while the foregoing is maintained, a constant acceleration test and an AC continuous operation test are simultaneously conducted on the semiconductor devices 4a and 4b.

In each of the embodiments of the present invention, the semiconductor devices 4a and 4b to be tested are firmly mounted on the upper surface of the turntable 12. In practice, however, it is more practical to mount each semiconductor device 4 to be tested firmly on an inner wall of a cylindrical drum constituting the turntable 12.

While the invention has been described in connection with what is presently considered to be the most practical and preferred embodiments, it is to be understood that the invention is not to be limited to the disclosed embodiments, but on the contrary, it is to cover various modifications and equivalent arrangements included within the spirit and scope of the appended claims.

Thus, it is to be understood that variations in the number of connection pins connected to the rotary terminals, the number of semiconductor devices and holders attached to the turntable, the particular holder and turntable configuration and elements employed, as well as the rotating terminal and the stationary terminal configurations and interactions can be made without departing from the novel aspects of this invention as defined in the claims.

In this connection, for example, the turntable may be arranged outside the drum to achieve higher frequency.

The device according to the present invention may be employed for the thermal load testing or electro-static discharging measurement other than described above.

What is claimed is:

1. A semiconductor device testing apparatus for concurrently conducting an AC continuous operation test and a constant acceleration test, comprising:
   a turntable that rotates so as to provide a substantially constant rotational acceleration to a semiconductor device that has connection pins;
   holding means, secured to said turntable, for firmly holding said semiconductor device, and for providing an electrical connection to a selected one of said connection pins;
   a rotary terminal secured to said turntable, and electrically connected to said holding means, thereby providing an electrical connection between said rotary terminal and said selected one of said connection pins; and
   a stationary terminal, which becomes intermittently electrically connected, due to said rotation of said turntable, to said rotary terminal, said stationary terminal electrically connected to an independent DC power supply;
   wherein said intermittent electrical connection of said rotary terminal and said stationary terminal creates a pulsating current in said rotary terminal while said substantially constant rotational acceleration of said semiconductor device is occurring.

2. An apparatus as in claim 1, wherein said turntable is cylindrical and surrounded by an annular drum.

3. An apparatus as in claim 2, wherein said annular drum is joined with said stationary terminal.

4. An apparatus as in claim 1, wherein a cylindrical drum is surrounded by said turntable which is annular.

5. An apparatus as in claim 4, wherein said cylindrical drum is joined with said stationary terminal.

6. An apparatus as in claim 1, wherein said power supply is a DC power supply.

7. A method for concurrently performing an AC continuous operation test and a constant acceleration test on a semiconductor device having connection pins comprising the steps of:
   a) firmly attaching said semiconductor device to a holder;
   b) rotating said semiconductor device at a substantially constant rotational acceleration; and
   c) applying, concurrently with step (b), an alternating current to at least one of the connection pins so as to perform said AC continuous operation test while performing said constant acceleration test.

8. A method as in claim 7, wherein said alternating current is generated by intermittently applying different independent DC power supplies to said at least one connection pin of said plurality of connection pins.

9. An apparatus for concurrently performing an AC continuous operation test and a constant acceleration test on a semiconductor device having connection pins comprising:

means for securely holding said semiconductor device;

acceleration means for rotationally accelerating said holding means at a substantially constant magnitude;

means for electrically connecting at least one of said connection pins to an edge of said acceleration means;

means for supplying different independent DC power supplies; and means for intermittently connecting said different independent DC power supply means to said at least one of said connection pins, thereby creating an AC current so as to perform said AC continuous operation test while concurrently performing said constant acceleration test.

10. A method for concurrently performing an AC continuous operation test and a constant acceleration test on a semiconductor device having a plurality of connection pins comprising the steps of:

a) firmly attaching said semiconductor device to a holder;

b) rotating said semiconductor device at a substantially constant rotational acceleration, thereby performing said constant acceleration test so as to allow a result gathering step of said constant acceleration test to be conducted; and c) applying, concurrently with step (b), an alternating current to at least one of the connection pins so as to perform said AC continuous operation test.

* * * * *